United States Patent [19]
Larson et al.

[11] Patent Number: 4,831,210
[45] Date of Patent: May 16, 1989

[54] SHIELDS FOR ELECTROMAGNETIC RADIATION

[75] Inventors: Gary B. Larson, Cheshire; Donald R. Ferrier, Thomaston; Stanley J. Ruszczyk, Naugatuck; Steven A. Castaldi, Waterbury, all of Conn.

[73] Assignee: MacDermid, Incorporated, Waterbury, Conn.

[21] Appl. No.: 127,783

[22] Filed: Dec. 2, 1987

[51] Int. Cl.⁴ .............................................. H05K 9/00
[52] U.S. Cl. ............................ 174/35 MS; 427/306; 427/419.5; 428/936
[58] Field of Search ...................... 174/35 MS File; 427/306, 419.5; 428/936

[56] References Cited
U.S. PATENT DOCUMENTS

| 4,169,171 | 9/1979 | Narcus | 427/306 X |
| 4,514,586 | 4/1985 | Waggoner | 174/35 MS |
| 4,578,310 | 3/1986 | Hatfield | 174/35 MS |
| 4,590,115 | 5/1986 | Cassat | 427/306 X |
| 4,663,240 | 5/1987 | Hajdu et al. | 174/35 TS X |

Primary Examiner—Arthur T. Grimley
Assistant Examiner—David A. Tone
Attorney, Agent, or Firm—St. Onge Steward Johnston & Reens

[57] ABSTRACT

Shielding means for electromagnetic radiation, particularly that of radio frequency, comprises a enclosure fabricated from non-conductive material and having on at least one of the interior or exterior walls a layer of copper metal. The latter has been applied by coating the surface of the wall with a suspension of particles of cuprous oxide (or like non-conductive metal derivatives capable of being reduced to conductive free metal) in a curable resinous material, at least partially curing the coating, reducing to free metal the cuprous oxide or like particles in the surface of the coating and then electrolessly plating the coating with copper.

12 Claims, 1 Drawing Sheet

SHIELDS FOR ELECTROMAGNETIC RADIATION

BACKGROUND OF THE INVENTION

1. Field of the Invention

This invention relates to electromagnetic radiation shielding and is more particularly concerned with containers fabricated from non-conductive materials and provided with a conductive metal layer on the inner and/or outer surface thereof and with novel methods of producing such containers.

2. Description of the Prior Art

It is generally necessary to provide means for shielding radio equipment and like equipment emitting electromagnetic radiations to prevent or attenuate the radiation being emitted. Indeed the FCC regulations require that certain categories of electronics and computer equipment be enclosed by radio-frequency interference shields.

Such shields generally comprise electrically conducting metal layers on the interior and or exterior surfaces of the enclosure for equipment which is the source of the radiation to be shielded. The metal coating can be applied by any of a variety of techniques such as brushing, spraying, vacuum metallization, electroless metal plating, adhering of metal foil and the like. One of the preferred techniques comprises electroless plating of metals on the surface of the enclosure. However, not all materials from which the enclosures are fabricated are susceptible to being plated in this manner. Thus many materials need careful surface preparation prior to electroless plating and, in some instances, the plating has a tendency to peel off or otherwise become loosened during the working life of the equipment. This is particularly so in the case of some plastic materials such as polycarbonate which are now being utilized in the fabrication of enclosures.

Illustrative of previous methods of preparing enclosure for shielding electromagnetic radiation, particularly that of radio frequency, is that shown in Waggoner U.S. Pat. No. 4,514,586 which describes electrolessly plating a layer of copper on an enclosure and then electrolessly plating the copper layer with a layer of a second metal such as nickel, cobalt and gold to protect the copper layer from deterioration due to oxidation. The process is illustrated using ABS as the substrate material and an elaborate procedure is described for pretreatment of the surface of the ABS prior to plating.

Narcus U.S. Pat. No. 4,169,171 describes a process of producing a decorative, metallized finish on an ABS substrate by a similar process to that described in the aforesaid Waggoner U.S. Pat. No. 4,514,586.

Cassat U.S. Pat. No. 4,590,115 describes the preparation of a plastic article having a decorative, metallized surface on at least one side thereof. The article is molded into the desired shape using a thermoplastic or thermoset resin having a high density of metal oxide particles uniformly suspended therein. At least one surface of the article is then subjected to the action of a chemical reducing agent to form a layer of free metal particles on said surface and additional metal is then electrodeposited on the surface which has been made electroconductive by the reduction step. The U.S. Pat. No. 4,590,115 summarizes the methods previously employed, particularly in fabrication of printed circuits, to introduce metallized patterns in selected areas of a substrate by first coating the areas in question with a suspension of cuprous oxide or other related metal derivatives in a curable resin, reducing the cuprous oxide or other metal derivative to free metal and then applying additional copper to said selected areas by electroless plating techniques.

It has not been suggested previously that means for shielding electromagnetic radiation, particularly such means obtained by fabrication from non-conductive plastic materials, could be derived readily utilizing a coating of a conductive metal which has not been applied directly to the non-conductive substrate but which has been applied after first coating the substrate surface with a suspension of cuprous oxide or like non-conductive metal in a curable resin, followed by reduction to free metal of at least the particles in the surface of said coating.

As will be described in detail hereinafter, significant advantages have been found to flow, both in terms of ease of processing and properties of the resulting product, from the use of such an approach.

SUMMARY OF THE INVENTION

It is an object of the invention to provide improved means for shielding electromagnetic radiation. It is a further object to provide a container adapted to attenuate electromagnetic radiation generated by the contents of the container, said container being fabricated from an electrically non-conductive material.

It is yet another object to provide a method for treating a container fabricated from an electrically non-conductive material to render said container capable of attenuating electromagnetic radiation generated by electronic devices housed within the container.

These objects, and other objects which will become apparent from the description which follows, are achieved by the shielding means and method of fabrication of the same which form the subject of this invention.

Thus the invention, in one embodiment thereof, comprises a method of attenuating electromagnetic radiation generated by a source of such radiation, said method comprising enclosing said source in a container fabricated from electrically non-conductive material and having on at least one of the inner and outer surfaces thereof an electromagnetic radiation attenuating layer of an electrically conducting metal said layer having been derived by the steps of:

applying to said surface a coating of a suspension, in a curable resinous material, of particles of a non-conductive metal derivative capable of being chemically reduced to electrically conductive free metal;

at least partially curing said coating;

subjecting said coating to chemical reduction to convert at least a portion of the particles of said metal derivatives to free metal; and electrolessly plating the so treated coating with copper.

The invention also comprises the container so produced in the above-described method.

The term "non-conductive metal derivative capable of being chemically reduced to electrically conductive free metal" means derivatives of non-precious metals such as copper, nickel, cobalt, lead, cadmium, chromium, antimony, tin and the like, which derivatives are not themselves electrically conducting but will undergo facile reduction by borohydrides, and like reducing agents hereinafter described, to give the electrically conductive free metal. Illustrative of such derivatives are cuprous oxide, cupric hydroxide, cupric carbonate, and the oxides of divalent lead, cobalt, nickel and cadmium, trivalent chromium and antimony and tetravalent tin. Preferred non-conductive metal derivatives for use in the process of the invention are cuprous oxide, cupric hydroxide and cupric carbonate. Most preferred is cuprous oxide and this particular derivative will be utilized in the following detailed description of the invention. It is to be understood however that this is done in the interest of brevity and the scope of the present invention is not to be construed as limited to the use of this particular derivative.

DETAILED DESCRIPTION OF THE INVENTION

Figure 1:
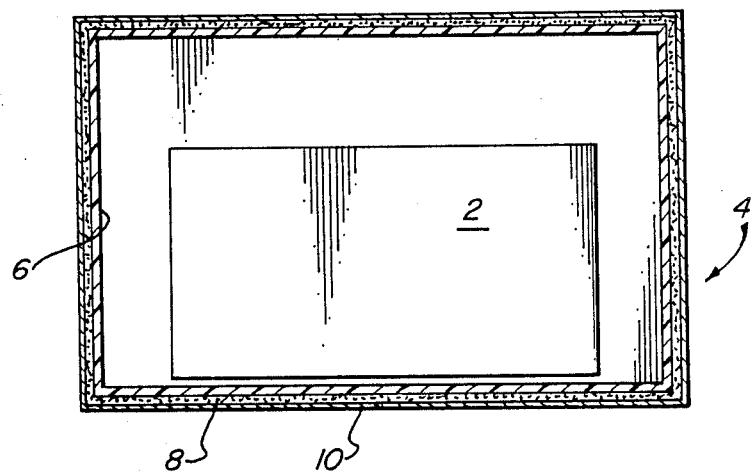
FIG. 1 shows in cross-section a source of radiation enclosed in a shielding device of the invention.

Shielding means presently employed in the art generally comprise an enclosure such as a cabinet and the like for receiving a radio or other electronic equipment. The enclosure is fabricated from an electrically nonconductive base material generally a thermoplastic or thermoset resin or like material. Illustrative of such resins and materials are synthetic organic polymeric materials such as acrylonitrile-butadiene-styrene (ABS), polypropylene oxide, polycarbonates, polyamides, polyimides and the like including reinforced plastics of this type, and other dielectric materials such as glass, ceramic, glass fiber, reinforced ceramic, pressed board and like materials. Such enclosures of electrically non-conductive material are provided on the inner or outer surfaces with an electrically conductive metal coating by techniques such as those described in the aforesaid Waggoner U.S. Pat. No. 4,514,586. However, many of the electrically non-conductive base materials employed to fabricate the enclosures are not capable of being electrolessly plated satisfactorily with copper and like metals unless careful, and often drastic, preparation of the surface of the base material is carried out. In certain cases such as the use of a non-platable ABS as the base material it is not possible to electrolessly plate the surface satisfactorily even after using any of the conventional methods of surface preparation.

In accordance with the present invention the difficulties in providing a layer of electrically conductive metal on the base material of the container are overcome and, simultaneously, an additional layer of dielectric material is introduced between the base material and the metal layer. Thus, in accordance with the invention one or both of the inner and outer surfaces of the enclosure formed from the base material is (are) coated with a layer of electrically conductive metal by a stepwise procedure as follows.

In the first step of the method of the invention the inner and or outer surface of the base material enclosure is coated with a layer of suspension of finely divided particles of cuprous oxide in a curable resinous material, which suspensions are described more fully hereinafter. The coating is effected in any known manner such as spraying, roller coating, brushing on and the like. The average thickness of the layer thus applied is not critical. Advantageously a thickness of about 4 mils is found to be appropriate but thinner or thicker layers can be employed if desired. The coating so applied is then cured, for example, by heating at the curing temperature of the resin employed in the coating. The cured coating is then submitted to chemical reduction, using techniques and compositions described hereinafter, to convert the cuprous oxide particles in the surface of the coating to metallic copper. Finally the enclosure is subjected to electroless plating with copper using conventional techniques to produce a layer of copper bonded to the cured, reduced coating via the particles of free copper generated in the surface of the coating by the reduction step. The electroless plating of copper is continued until the average thickness of the copper layer has reached about 0.05 mils and preferably about 0.1 mils but lower or higher thicknesses of copper can be employed if desired.

Illustrative of curable resins which can be employed as the carrier in the cuprous oxide suspension are thermosetting resins such as phenolic resins including the novalak type resins formed by condensation of phenol, resorcinol, cresol and the like with formaldehyde, furfural and the like; unsaturated polyester resins such as those derived from an unsaturated polycarboxylic acid including maleic, fumaric, citraconic and like acids, and a polyalkylene glycol; and epoxy resins such as the reaction product of epichlorohydrin (1-chloro-2,3-epoxypropane) or 1,2,3,4-diepoxybutane with bisphenol A, resorcinol, hydroquinone, 1-5-dihydroxynaphtha-lene and the like.

The preferred resins for use in accordance with the invention are epoxy resins and a particularly preferred group are epoxy resins derived from Bisphenol A.

The cuprous oxide employed in suspension in the curable resin should be present in finely divided particulate form. Advantageously the cuprous oxide has an average particle size of about 3 to 25 microns and preferably has an average particle size of about 4 to 7 microns.

The proportion of cuprous oxide in the suspension in the curable resin can vary over wide limits from about 50 percent to about 80 percent by weight based on total weight of the suspension. Preferably the cuprous oxide is employed in a concentration of about 70 percent to about 75 percent by weight. The suspension is prepared in any convenient manner by intimately mixing the ingredients using methods and equipment conventional in the art.

The suspension of cuprous oxide in curable resin may also comprise catalysts for curing of the resins and additives of the type used in paints such as modifiers, thixotropic agents, levelling agents, fillers, pigments and the like, if desired. The suspension of cuprous oxide may also be diluted up to about an equal amount by volume with a solvent or mixture of solvents such as ketones, glycol ethers, glycol ether esters, aromatic hydrocarbons and the like.

The method by which the curing of the suspension of cuprous oxide in resin is effected depends upon the nature of the particular resin employed. In many cases the curing is carried out using heating alone but in other cases, such as epoxy resins and the like it is necessary to incorporate a catayst or curative into the resin composition prior to application to the surface of the board. Any of the conventional catalysts or hardeners known in the art for use with the particular resin can be employed in the above curing process.

The cured coating of cuprous oxide particles suspended in resin is then subjected to the action of a chemical reducing agent wherein the particles of cuprous oxide which are present in, or adjacent to, the surface of the coating are reduced to metallic copper. Provided that the concentration of cuprous oxide, and hence of metallic copper produced therefrom, is appropriately chosen the surface of the coating may become conducting to an extent such that additional copper can be plated thereon by electrolytic deposition using conventional techniques and equipment. In general, however, the presence of metallic copper in the surface of the coating facilitates the further deposition of copper thereon by electroless plating techniques and ensures that excellent adhesion of the electroless copper to the coating takes place.

The reducing agents which are employed in conversion of the cuprous oxide to copper are inclusive of boron compounds such as dimethylaminoborane and the like disubstituted amino boranes, and alkali metal borohydrides in which up to 3 hydrogen atoms have been subjected by alkyl, alkoxy, aryl and like radicals. Illustrative of such borohydrides are sodium borohydride, potassium borohydride, sodium diethylborohydride, sodium trimethoxyborohydride, potassium triphenylborohydride and the like.

The reduction step is carried out conveniently by bringing the coated enclosure surface into contact with a solution of the reducing agent in water or a mixture of water and a lower aliphatic alochol. Advantageously the enclosure is immersed in a bath of the solution for a time sufficient to achieve conversion of the cuprous oxide particles in the surface layer of the image to metallic copper but insufficient to cause reduction of all cuprous oxide particles in the coating. The appropriate amount of time necessary in any given instance can be readily determined by a process of trial and error. The concentration of reducing agent employed in the solution is advantageously of the order of about 0.2 percent to about 0.6 percent weight by weight and preferably of the order of about 0.2 to about 0.3 percent weight by weight. The reduction can be carried out at elevated temperatures up to about 55° C. to about 30° C.

When the reduction step is completed the cuprous oxide particles in the surface of the coated enclosure have been converted to metallic copper. The resulting enclosure surface is subjected to electroless deposition of copper to build up the required thickness of copper. Any of the methods and compositions conventionally employed in the art of electroless deposition of copper can be used in this step. Illustrative of such methods and compositions are those described by Raymond H. Clark, Handbook of Printed Circuit Manufacturing, pp 300–324, Van Nostrand Reinhold Company, New York, 1985.

Figure 2:
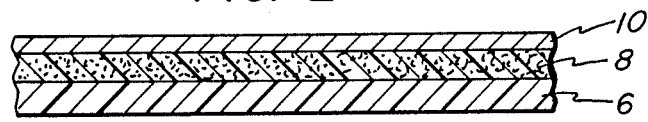
FIG. 2 shows in enlarged cross-section a portion of the wall of a shielding device of the invention.

A typical shielding device in accordance with the invention is shown overall as (4) in FIG. 1. The shielding device (4) has a rectangular cross-section and serves to enclose a source of radiation (2). A portion of the wall of shielding device (4) is shown in enlarged cross-section in FIG. 2. The inner wall (6) of the device is fabricated from an electrically non-conductive material such as ABS and like resins hereinabove described. The layer (8) is a suspension of cuprous oxide in a resin as hereinabove described and the outer layer (10) is a layer of copper resulting from chemical reduction of the cuprous oxide particles originally present in the outer surface of layer (8) followed by electroplating of additional copper on the copper particles generated by reduction of the cuprous oxide.

The shielding enclosure prepared in accordance with the invention are characterized by the strength of bonding of the copper metal layer on the electrically non-conductive substrate irrespective of the nature of the latter. Further this outstanding adhesion of the layer to the substrate is achieved without any need to prepare the surface of the substrate in any particular manner. The method of the invention also incorporates an additional layer of dielectric material between the layer of copper and the surface of the substrate this layer comprising a suspension in resin of the cuprous oxide particles which have not been reduced during reduction of the surface layer of particles.

If desired, the copper layer produced on the surface of the enclosure as described above can be protected against oxidation and or other potentially corrosive forces by applying thereto an appropriate masking material such as a coating of polymeric material such as polyurethane, epoxy resins and the like or by electrolessly plating the copper layer with a layer of a metal such as nickel, cobalt and the like.

It will be understood that modifications can be made to the embodiments that have been described above, especially through substitution of equivalent non-noble metal oxides, such as nickel, cobalt, lead, cadmium, chromium, antimony and tin oxides for the cuprous oxide employed in the above-described process.

The following examples illustrate the process and products of the invention and the best mode known to the inventors of carrying out the same but are not to be construed as limiting.

EXAMPLE 1

An enclosure for a microcomputer printed molded from ABS resin was cleaned by immersion for 5 minutes in a mild alkali bath [Metex TM TS40A: MacDermid Inc.] and dried. The surfaces of the enclosure were then sprayed with a coating obtained by mixing (a) 100 parts by weight of a suspension containing approximately 80 percent by weight of cuprous oxide having an average particle size of about 5 microns dispersed in an epoxy derivative of Bisphenol A [Araldite 6010: Ciba-Geigy] and (b) 12 parts by weight of a solution of 25 parts by weight of triethylene tetramine in 75 parts by weight of methyl ethyl ketone. A coating having an average thickness of 2 mils was applied in this manner. The coating on the enclosure was cured by heating at 65° C. for 60 minutes. After cooling, the enclosure was thoroughly rinsed with water and then immersed for 5 minutes in an aqueous solution at 30° C. containing 2 g. per liter of dimethylaminoborane and 76 g. per liter of sodium hydroxide. Thereafter the enclosure was thoroughly washed with water and electrolessly plated with copper by immersing for 30 minutes in an electroless copper plating bath [Macuplex TM 9027: MacDermid] at 30° C. The plated enclosure was finally rinsed with water and dried. The copper plating showing excellent adhesion to the substrate. The enclosure was found to possess a satisfactory level of shielding of electromagnetic radiation generated by the microcomputer printer when the latter was housed in the enclosure.

EXAMPLE 2

Enclosures of the same type as described in Example 1 but fabricated from polyurethane, polyphenylene oxide, polyester, polycarbonate, polyepoxide, and glass filled epoxy resin were each coated with a suspension of cuprous oxide using the materials and process described in Example 1. The coated enclosures were subjected to the subsequent steps of reduction and electroless copper plating using the procedure and materials described in Example 1. Each of the resulting enclosures was found to possess a satisfactory level of shielding of electromagnetic radiation generated by a microcomputer printed when the latter was housed in the enclosure.

EXAMPLE 3

An enclosure of the same type as described in Example 1 but molded from fiber glass filled epoxy resin was sprayed using the procedure described in Example 1 but employing a suspension obtained by mixing (a) 100 parts by weight of a 60% w/w suspension of a commercial grade of cupric carbonate in Araldite 6010 and (b) 12 parts by weight of a solution of 25 parts by weight of triethylene tetramine in 75 parts by weight of methyl ethyl ketone. A coating having a thickness of 4 mils was applied in this manner. The coating was cured for 3 hours at 70° C. Thereafter the enclosure was rinsed with water and then immersed for five minutes in an aqueous solution maintained at 60° C. and containing 3 g. per liter of dimethylaminoborane, 8 g per liter of sodium hydroxide and 5 percent v/v of propylene glycol. The part so treated was rinsed with water and then electrolessly plated with copper using the procedure and conditions employed in Example 1.

The resulting coating showed excellent adhesion characteristics and a shielding effect substantially equal to that of the enclosure obtained as described in Example 1.

EXAMPLE 4

The preparation of a coated enclosure described in Example 3 was repeated exactly except that the coating mixture employed was a suspension obtained by mixing (a) 100 parts by weight of a 70 percent w/w suspension of freshly precipitated and dried cupric hydroxide in Araldite 6010 and (b) 12 parts by weight of a solution of 25 parts by weight of triethylene tetramine in 75 parts by weight of methyl ethyl ketone. The coating had an average thickness of 4 mils and was cured for 15 minutes at 80° C. before being subjected to the reduction and plating steps described in Example 3. The resulting enclosure exhibited shielding characteristics comparable to those of the enclosure of Example 1.

What is claimed is:

1. An enclosure adapted to attenuate electromagnetic radiation, said enclosure being fabricated from electrically non-conductive material and having on at least one of the inner and outer surfaces thereof an electromagnetic radiation attenuating layer of an electrically conductive metal, said layer having been derived by the steps of
   applying to said surface a coating of a suspension, in a curable resinous material, of particles of a non-conductive metal derivative capable of being chemically reduced to electrically conductive free metal;
   curing said coating;
   subjecting said coating to chemical reduction to convert at least a portion of the particles of said metal derivatives to free metal; and
   electrolessly plating the so treated coating with copper.

2. An enclosure according to claim 1 wherein the electrolessly plated copper layer is subsequently coated with a material which protects said copper layer against oxidation.

3. An enclosure according to claim 1 wherein the non-conductive metal derivative capable of being chemically reduced is cuprous oxide.

4. An enclosure according to claim 1 wherein the non-conductive metal derivative capable of being chemically reduced is cupric hydroxide.

5. An enclosure according to claim 1 wherein the non-conductive metal derivative capable of being chemically reduced is cupric carbonate.

6. An enclosure according to claim 1 wherein said particles of non-conductive metal derivative are reduced using an aqueous solution comprising dimethylaminoborane or an alkali metal borohydride.

7. An enclosure according to claim 6 wherein the reduction is carried out using an aqueous alkaline solution of dimethylaminoborane.

8. An enclosure according to claim 1 wherein the electrically non-conductive material from which the container is fabricated is a thermoplastic resin.

9. An enclosure according to claim 8 wherein said thermoplastic resin is ABS.

10. An enclosure according to claim 1 wherein the curable resinous material in which the particles of non-conductive metal derivative are suspended is a thermoset resin.

11. An enclosure according to claim 10 wherein said thermoset resin is an epoxy resin.

12. A method of attenuating electromagnetic radiation emitted by a source of such radiation said method comprising enclosing said source in an enclosure according to claim 1.

* * * * *